(12) United States Patent
Yu

(10) Patent No.: US 10,542,602 B2
(45) Date of Patent: Jan. 21, 2020

(54) INDIVIDUALLY ACCESSIBLE LED LIGHT SYSTEM

(71) Applicant: 1 Energy Solutions, Inc., Irwindale, CA (US)

(72) Inventor: Jing Jing Yu, Irwindale, CA (US)

(73) Assignee: 1 Energy Solutions, Inc., Irwindale, CA (US)

( * ) Notice: Subject to any disclaimer, the term of this patent is extended or adjusted under 35 U.S.C. 154(b) by 0 days.

(21) Appl. No.: 16/396,179

(22) Filed: Apr. 26, 2019

(65) Prior Publication Data

US 2019/0342967 A1 Nov. 7, 2019

Related U.S. Application Data

(60) Provisional application No. 62/665,360, filed on May 1, 2018, provisional application No. 62/675,015, filed on May 22, 2018, provisional application No. 62/718,835, filed on Aug. 14, 2018.

(51) Int. Cl.
*H05B 37/00* (2006.01)
*H05B 33/08* (2006.01)

(52) U.S. Cl.
CPC ..... *H05B 33/0857* (2013.01); *H05B 33/0821* (2013.01)

(58) Field of Classification Search
CPC ............ H05B 33/0815; H05B 33/0818; H05B 41/2828; H05B 41/3921; H05B 41/3927; H05B 41/28; H05B 37/029; H05B 33/0803; H05B 37/0254; H05B 37/02; G09G 3/3648; G09G 3/3614; G09G 3/3688; G09G 3/3611; G09G 3/3655; G09G 2330/021; G09G 2310/027; G09G 5/006

See application file for complete search history.

(56) References Cited

U.S. PATENT DOCUMENTS

2017/0105265 A1* 4/2017 Sadwick .............. A61N 5/0618

\* cited by examiner

*Primary Examiner* — Minh D A
(74) *Attorney, Agent, or Firm* — William W. Cochran; Cochran Freund & Young LLC

(57) ABSTRACT

Disclosed is an individually accessible LED light system in which color and luminosity of the LED lights are individually controlled. Each of the LED lights can comprise an LED light bank, which can contain any number of lights. The primary colors can be used in the LED bank to create any desired color. The LED light bank can also be incorporated on a single chip with an address and control circuit.

14 Claims, 14 Drawing Sheets

INDIVIDUALLY ACCESSIBLE LED LIGHT SYSTEM

CROSS-REFERENCE TO RELATED APPLICATION

This Non-Provisional patent application claims the benefit of the U.S. Provisional Patent Application No. 62/665,360, entitled "Individually Accessible Led Light System," which was filed with the U.S. Patent & Trademark Office on May 1, 2018, the U.S. Provisional Patent Application No. 62/675,015, entitled "A Surface Mounted and Chip On Board, High Brightness Led Replaceable Lighting System," filed on May 22, 2018, and U.S. Provisional Patent Application No. 62/718,835, entitled "Waterproof, Dual-Polarity Decorative Light String," filed on Aug. 14, 2018, all of which are specifically incorporated herein by reference for all that they disclose and teach.

BACKGROUND OF THE INVENTION

LEDs have become an important product for lighting. LEDs can operate at low DC voltages, and are very efficient at producing light energy. Further, LEDs do not produce a significant amount of heat and therefore are safer to use in many different environments.

SUMMARY OF THE INVENTION

An embodiment of the present invention may therefore comprise a system for controlling illumination and color of individual LED lights of a plurality of individually accessible LED lights comprising: a power supply that is connected to the plurality of individually accessible LED lights, the power supply generating a power signal that is amplitude modulated with a signal address that is an address encoded in the power signal of at least one of the individual LED lights of the plurality of individually accessible LED lights, and illumination data for the at least one of the individual LED lights of the plurality of individually accessible LED lights, to create an encoded amplitude modulated power signal; an address circuit that generates a chip address for the individual LED lights; a control circuit in the individual LED lights that compares the chip address with the signal address, downloads the illumination data whenever there is a favorable comparison of the chip address and the signal address and generates pulse width modulation signals in accordance with the illumination data to control illumination of the individual LED lights; an LED light bank having at least one LED that receives the pulse width modulation signal and is illuminated in accordance with the duty cycle of the pulse width modulation signal.

An embodiment of the present invention may further comprise a method of controlling illumination and color of individual LED lights of a plurality of individually accessible LED lights that are connected to a power source comprising: amplitude modulating a power signal, from the power source, that powers the plurality of individually accessible LED lights, with a signal address and illumination data, to generate an encoded amplitude modulated power signal which individually addresses and controls the individual LED lights; transmitting the encoded amplitude modulated power signal to the individual LED lights; providing chip addresses that comprise a specified address for the individual LED lights; comparing the signal address of the encoded amplitude modulated power signal with the chip addresses of the individual LED lights; downloading the illumination data in the individual LED lights whenever there is a favorable comparison between the signal address and the chip address; illuminating the individual LED lights in accordance with the illumination data.

DETAILED DESCRIPTION OF THE EMBODIMENTS

Figure 1:
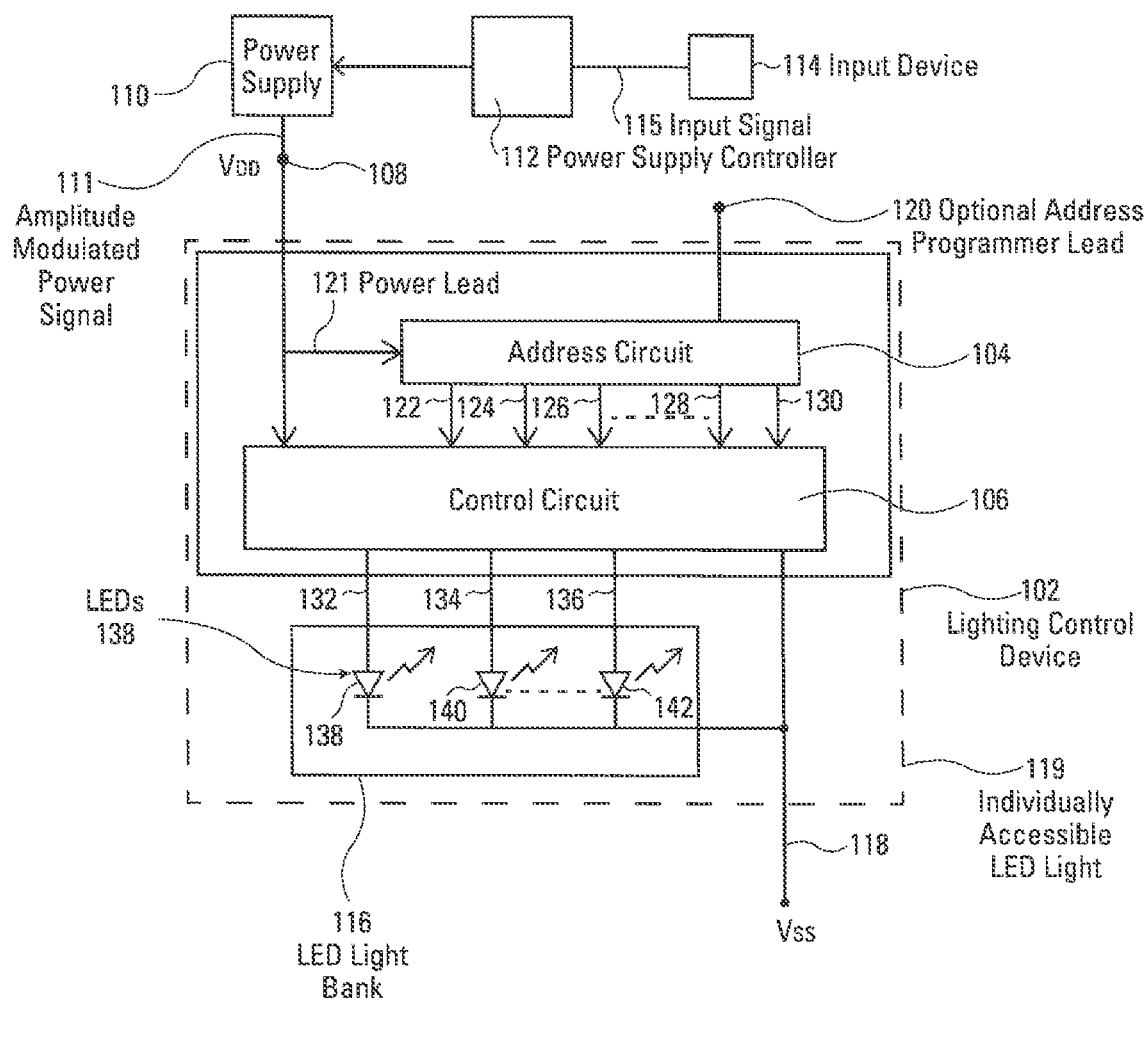
FIG. 1 is a schematic block diagram of an embodiment of the individually accessible LED light system.

FIG. 1 is a schematic block diagram of an individually accessible LED light system. As illustrated in FIG. 1, the individually accessible LED light system 100 includes a lighting control device 102. The lighting control device 102 may be formed on a single integrated circuit chip or several different integrated circuits. A single chip may also include the LED light bank 116 that may have any number of LEDs 138 disposed on the chip. The lighting control device 102 includes an address circuit 104 that has a specific address for the individually accessible light 119 illustrated in FIG. 1. A control circuit 106 receives signals from the address circuit 104 and from the power supply 110 and generates control signals 132, 134, 136, that control the LEDs 138 that form the LED light bank 116. Each of the LEDs 138, 140, 142 may comprise a single LED that can be either white, or a color LED or, more typically, three LEDs that have three different colors such as red, green and blue (RGB). With RGB LEDs, which are primary colors, the intensity of each of the LEDs can be controlled to create any desired color, including white. The optical outputs of the RGB LEDs combine and are perceived by the eye as a color depending upon the intensity of each of the RGB LEDs. Again, any color can be created using the three primary colors red, green and blue, by simply controlling the intensity of each of the RGB LEDs. The LEDs 138 may also comprise strings of LEDs that are connected in various ways. The modulated power control signal is then supplied to the output VSS 118, which may be connected to another individually accessible LED light connected in series.

FIG. 1 illustrates a single LED light bank 116 that is controlled by the lighting control device 102, which controls the intensity of each of the RGB LEDs 138, 140, 142. The module that includes the lighting control device 102 and the LED light bank 116, which collectively is referred to herein as an individually accessible LED light 119, may be connected in series or parallel, or any combination thereof, with other individually accessible LED lights, and individually accessed by an address signal and individually controlled by an amplitude modulated power signal 111 applied to the VDD input 108. As disclosed in more detail below, the VSS output of the individually accessible LED lights is connected to VDD inputs of other individually accessible LED lights that are connected in series, or to the cathodes of other individually accessible LED lights connected in parallel.

To control both the color and intensity of each of the individually accessible LED lights, such as individually accessible LED light 119, a user generates an input signal 115, using an input device 114. The input device 114 may be a manual input device, a computerized control system, a system that selects one of many different pre-programmed selection of control signals, etc. The input signal 115 controls the power supply controller 112, which is connected to the power supply 110, and controls the output voltage of the power supply 110. In other words, the power supply controller 112 amplitude modulates the output of the power supply 110 that is applied to VDD 108. The amplitude modulation of the output of the power supply 110 contains an address for each of the individually accessible LED lights as well as the output intensity of each of the RGB LEDs 138. As such, the power signal at the output of power supply 110 is an amplitude modulated power signal that is encoded with both address data and illumination data.

Figure 9:
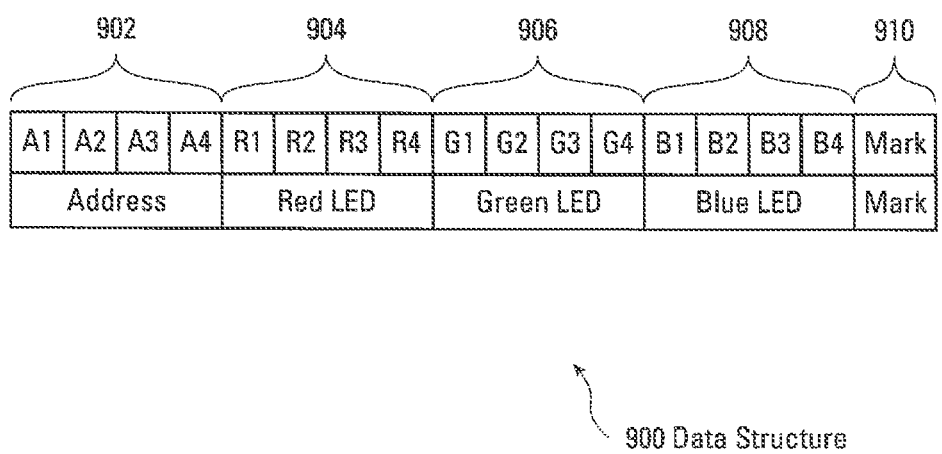
FIG. 9 is a schematic diagram of the structure of the address and control signals.

The lighting control device 102 includes an address circuit that provides a specific chip address for each of the individually accessible LED lights, such as individually accessible LED light 119 that is illustrated in FIG. 1. Each of the individually accessible LED lights that are connected in parallel or series receive the amplitude modulated power signal 111. Each of the individually accessible LED lights has an address circuit, which provides the chip address for that individually accessible LED light, so that that individually accessible LED light can be controlled in a lighting system, as explained in more detail below. The address circuit 104 provides the chip address of the individually accessible LED light 119 to the control circuit 106. Control circuit 106 receives the modulated power signal from VDD terminal 108 and compares the signal address portion of the amplitude modulated power signal 111 with the chip address supplied by address circuit 104. If there is a match, the control circuit reads the remaining portion of the data provided in the amplitude modulated power control signal, such as illustrated in FIG. 9, which is the illumination data, to generate power signals 132, 134, 136, to illuminate the LEDs 138 and the LED light bank 116 in accordance with the illumination data.

The address circuit 104 of FIG. 1 may constitute many different types of address circuits. For example, address circuit 104 may be a hard-wired address circuit that connects the power lead 121 to one or more of the outputs 122, 124, 126, 128, 130, as explained in more detail below, with respect to FIG. 2. Additionally, an optional address program lead 120 can be provided to the address circuit 104 to program a specified chip address in the address circuit. For example a plurality of EPROMS or EEPROMS could be used as the address circuit 104, which can be programmed through the optional address program lead 120. Also, address circuit 104 can be a simple switch circuit so that the address of the individually accessible LED lights 119 can be manually designated by operating the switches on the address circuit 104.

Figure 2:
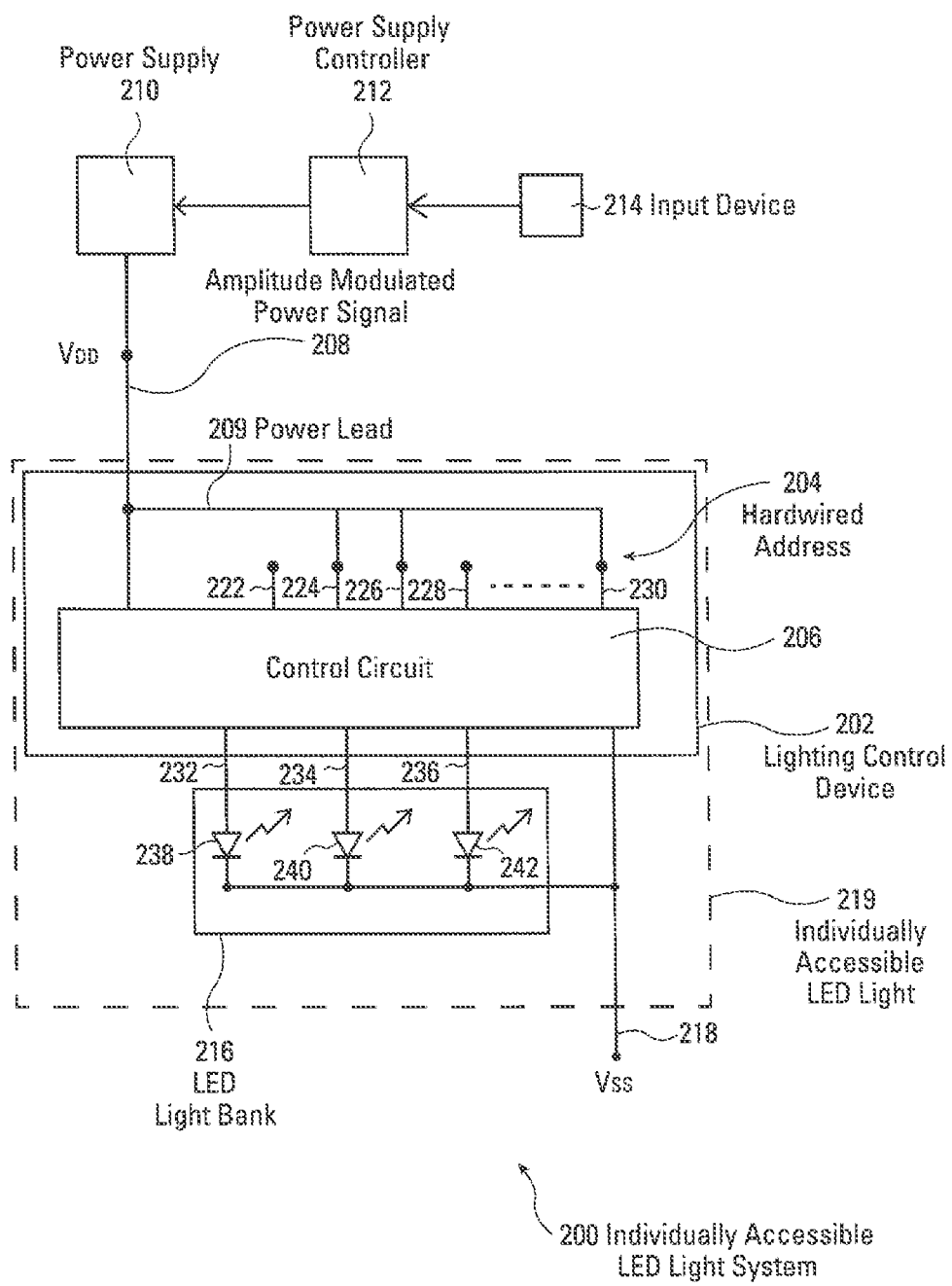
FIG. 2 is a schematic diagram of another embodiment of an individually accessible LED light system.

FIG. 2 is a schematic block diagram of another embodiment of an individually accessible LED light system 200. FIG. 2 illustrates an individually accessible LED light system 200 that includes an individually accessible LED light 219, power supply 210, power supply controller 212 and an input device 214. Input device 214, in the same manner as input device 114 of FIG. 1, generates an input signal 215, similar to input signal 115 of FIG. 1, that is applied to the power supply controller 212. Power supply controller 212 is similar to the power supply controller 112 of FIG. 1, and generates a control signal that amplitude modulates the amplitude modulated power signal 208 generated by power supply 210. The input lead 108 at VDD receives the amplitude modulated power signal 208, which is applied to the lighting control device 202, that controls the intensity of the LEDs 238, 240, 242 in the LED light bank 216. The lighting control device 202 includes a hard wired chip address 204 that is applied to the control circuit 206. In other words, the power lead 209 is connected to one or more of the control circuit address inputs 222, 224, 226, 228, 230, or other possible number of inputs. For example, in digital systems, a single input would provide for two binary addresses, while a double input would provide for four binary addresses. Similarly, three inputs would provide for eight binary addresses, four inputs would provide for sixteen binary addresses, five inputs would provide for thirty-two binary addresses, while six inputs would provide for sixty-four binary addresses.

Each lighting control device 202 can be hard wired with a chip address, as shown in FIG. 2, so that the individually accessible LED light 219 can be specifically controlled at the chip address, which has been hard wired into the lighting control device 202 that is applied to the control circuit 206. In that regard, when the amplitude modulated power signal 208 is applied on the power lead 209, control circuit 206 reads a power input on leads 224, 226 and 230. These constitute a binary chip address that is compared in the control circuit 206 with a signal address that is provided on the amplitude modulated power signal 208. In that regard, the amplitude modulated signal has a structure, such as illustrated in FIG. 9, in which the initial four bits of the amplitude modulated signal, after the mark or flag, is considered to be the signal address. Of course, any number of bits can be designated. For example, if there are as many as sixty-four individually accessible LED lights that need to be controlled, a six-bit signal should be used. As explained below, FIGS. 6-9 provide an example of the manner in which the power signal can be amplitude modulated to provide the signal address and control bits that are used by the control circuit 206 to address specific lighting control devices, such as lighting control device 202, so that a control circuit, such as control circuit 206, can control the intensity of each of the LEDs 238, 240, 242, in the LED light bank 216. When the control circuit 206 identifies a signal address on the amplitude modulated power signal 208 that matches the hardwired chip address 204, the bits to control each of the LEDs 238, 240, 242, which comprise illumination data, are read by the control circuit and the control circuit generates a pulse width modulation signal that is applied to each of the LEDs 238, 240, 242 that correspond to the intensity designated by the encoding of the amplitude modulated power signal 208.

As illustrated in FIG. 2, the individually accessible LED light 219 can be constructed on a single chip or on separate chips. Since the chips are hard wired, the address for each of the individually accessible LED lights 219 can be printed on the chip, so that displays or light strings can be constructed in a simple and easy fashion.

Figure 3:
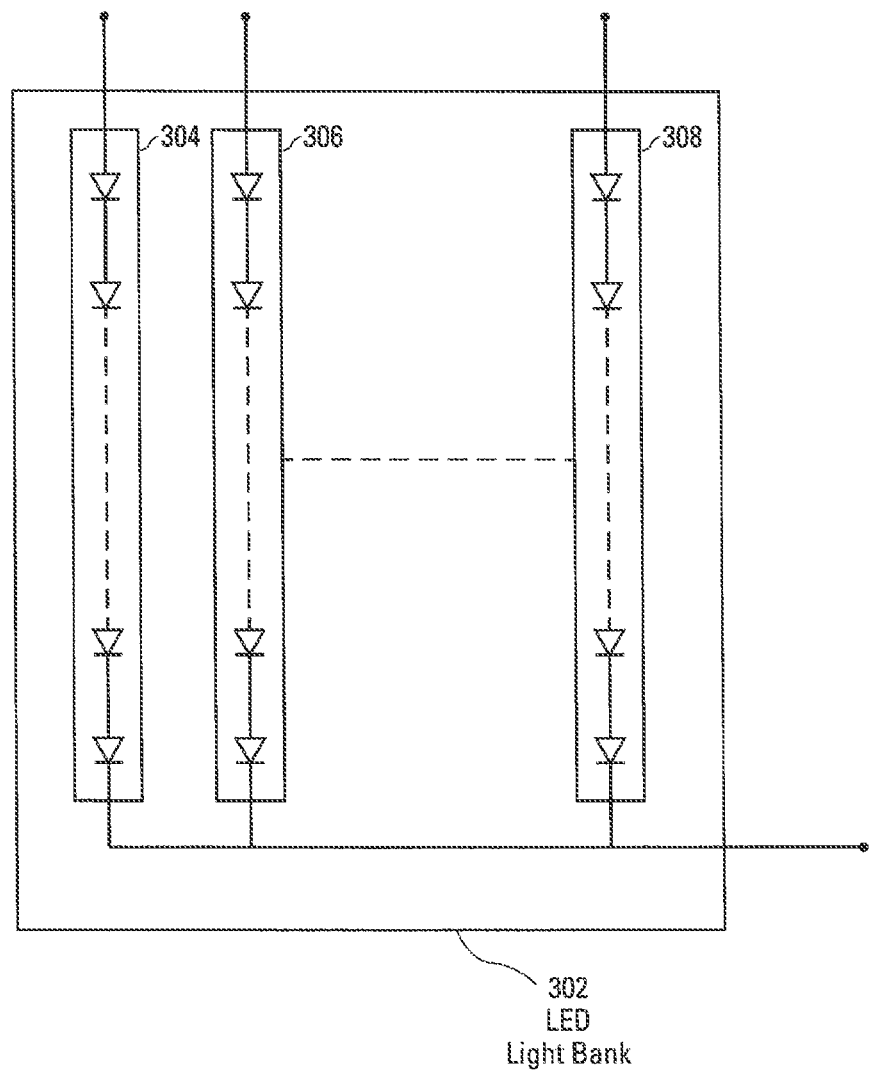
FIG. 3 is a schematic diagram of an LED light block.

FIG. 3 is a schematic diagram of an LED light bank 302 that may correspond to the LED light bank 116 of FIG. 1 and the LED light bank 216 of FIG. 2. As illustrated in FIG. 3, each of the LED lights 304, 306, 308 comprise a string of serially connected LEDs. For example, the LED light 138 of FIG. 1 and the LED light 238 of FIG. 2 may correspond to a light string, such as light string 304. In this manner, more elaborate light displays can be used and controlled by the control circuit 106 of FIG. 1, and the control circuit 206 of FIG. 2. The light displays can constitute either strings of lights or matrices of lights, as desired. The strings of lights may be laid out in a matrix to form a display or sign. Light string 306 may correspond to LED 140 of FIG. 1, and LED 240 of FIG. 2, and light string 308 may correspond to LED 142 of FIG. 1 and LED 242 of FIG. 2. Also, these strings 304, 306, 308 can also constitute any of the strings in FIGS. 11-14.

Figure 4:
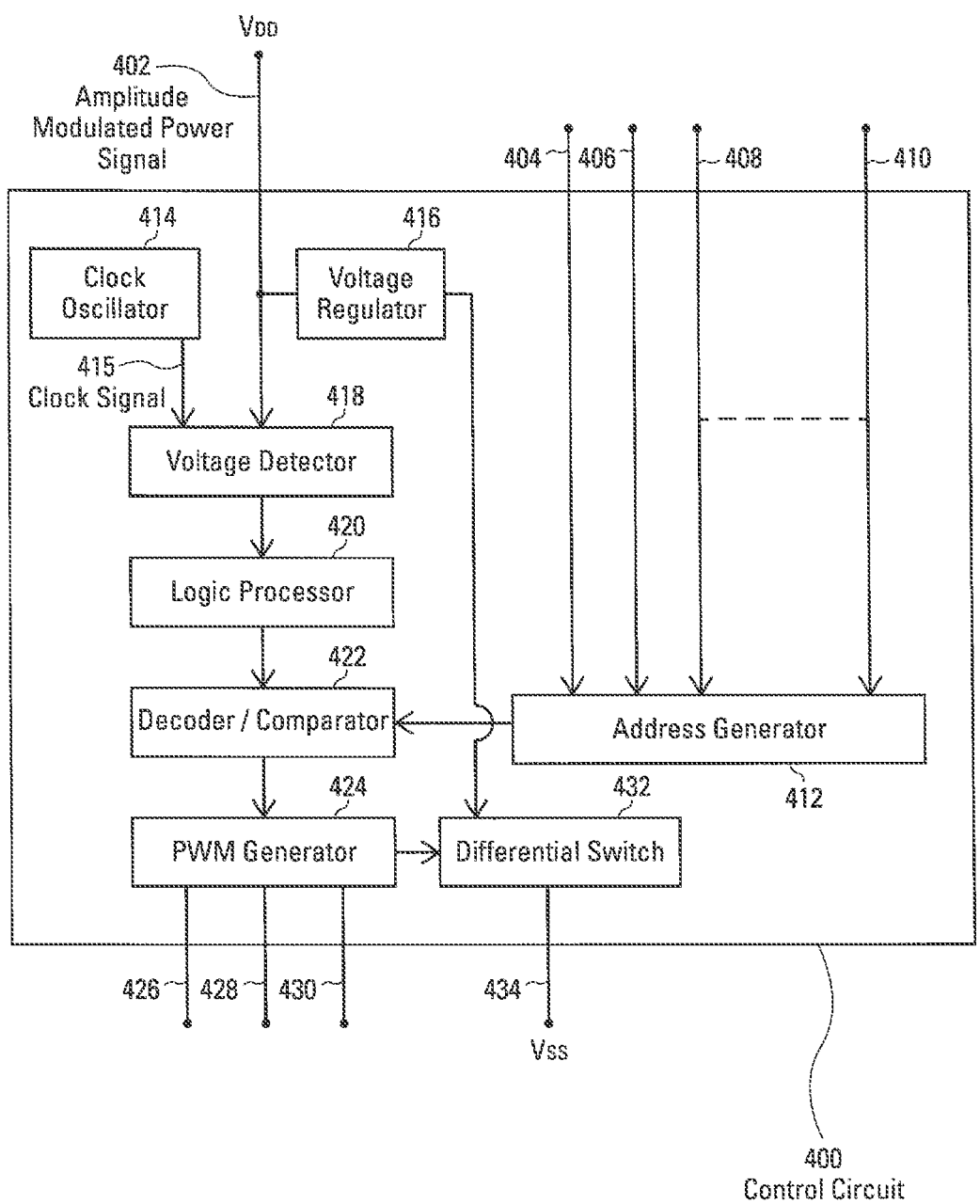
FIG. 4 is a schematic block diagram of an embodiment of a control circuit.

FIG. 4 is a schematic block diagram of an embodiment of a control circuit 400 that corresponds to control circuit 106 of FIG. 1 and control circuit 206 of FIG. 2. The control circuit 400 receives the amplitude modulated power signal 402, which is connected to a voltage regulator 416. Voltage regulator 416 receives the amplitude modulated power signal 402 and regulates the voltage so that a stable working voltage is supplied to the components of the control circuit 400. The voltage regulator 416 is also connected to the differential switch 432, which provides a constant output current so that the LEDs are lit with accurate color and brightness. Clock oscillator 414 generates a clock signal 415, which is applied to the voltage detector 418. Clock oscillator 414 comprises an RC oscillator circuit, or other similar circuit, which generates clock pulses at a specific frequency. For example, the clock pulses may be a few hundred kilohertz in one embodiment. Clock signal 415 is a reference clock pulse that is used by the voltage detector to sample the amplitude of the amplitude modulated power signal 402 at the clock intervals. Voltage detector 418 determines the amplitude of the sampled amplitude modulated power signal 402 at each sampled clock pulse. The amplitude value of the samples of the amplitude modulated power signal at each clock pulse is then transmitted to the logic processor 420. The logic processor 420 produces a binary signal from the amplitude samples of the amplitude modulated power signal 402 at each clock pulse. This binary data is transmitted as 1's and 0's to the decoder/comparator 422. This binary data includes both the signal address and illumination data. Simultaneously, address generator 412 generates a binary code that corresponds to the chip address based upon the address inputs 404, 406, 408, 410. Address generator 412 generates a binary code for the chip address, which is compared to the signal address binary code of the amplitude modulated power signal 402. If there is a favorable comparison, the remaining portions of the binary code from the amplitude modulated power signal 402, which is the illumination data, are transmitted to the pulse width modulation (PWM) generator 424. The PWM signals 426, 428, 430 generated by the PWM generator power the LEDs and the LED light banks, such as LED light bank 116 of FIG. 1 and LED light bank 216 of FIG. 2, which illuminates the LEDs in accordance with the duty cycle of the PWM power signals. Also, a voltage signal from PWM generator 424 is transmitted out of the control circuit 400 to the differential switch 432.

Figure 5:
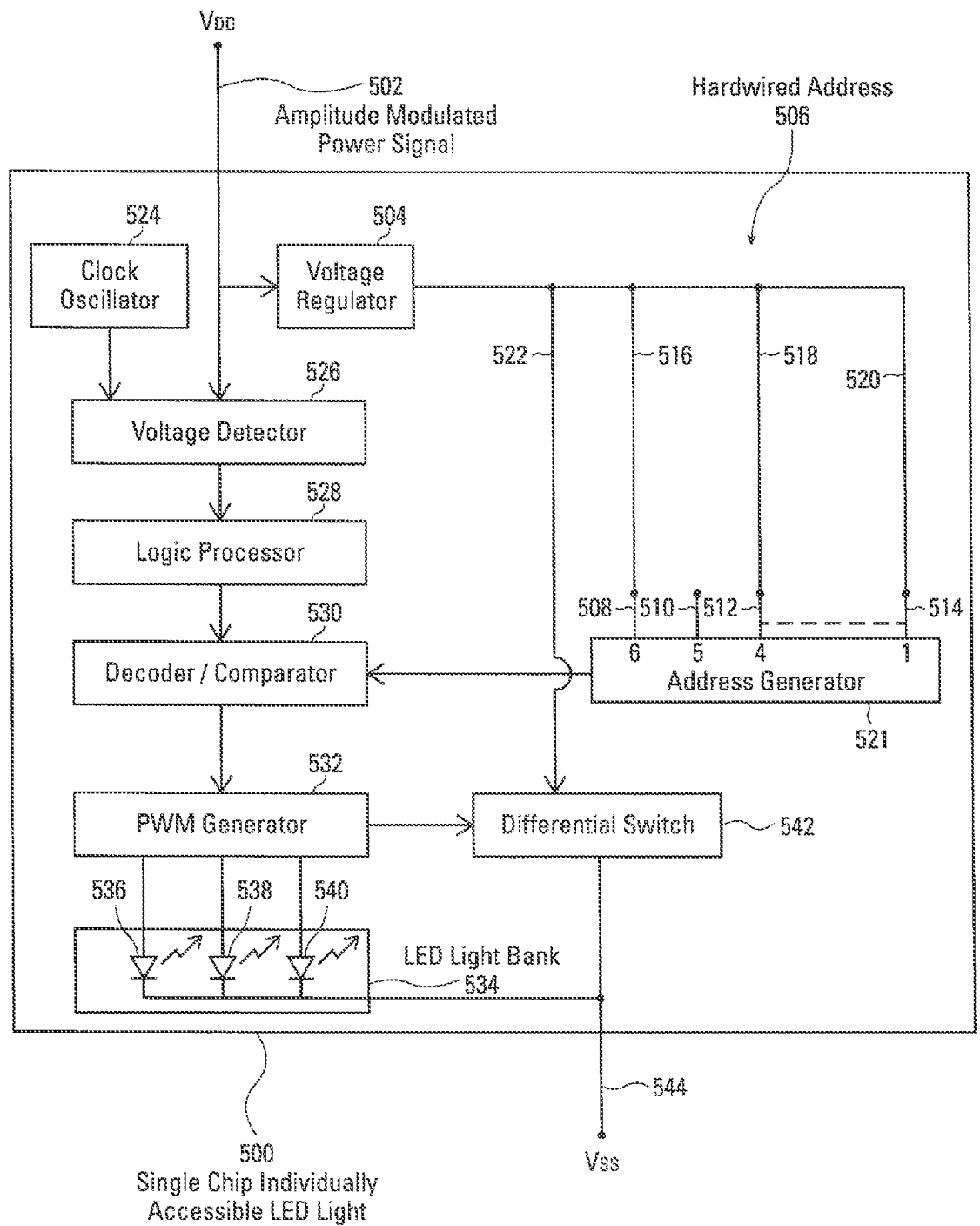
FIG. 5 is a schematic block diagram of a single chip individually accessible LED light.

FIG. 5 is a schematic block diagram of an embodiment of a single chip individually accessible LED light 500. As illustrated in FIG. 5, the address circuit 506, the control circuit and the LED light bank 534 are all disposed on a single integrated circuit chip 500. The amplitude modulated power signal 502 is applied to the input VDD. The amplitude modulated power signal is applied to the voltage regulator 504 and voltage detector 526. The chip 500 utilizes a hard wired chip address 506. The voltage regulator 504 regulates the voltage and applies a voltage signal to address lines 516, 518, and 520. These correspond to chip address inputs 508, 512, 514 of address generator 521. Address input 508 is the sixth bit in the address generator, while address input 512 is the fourth bit and address input 514 is the first bit. A voltage signal is not applied to input 510, which is the fifth bit. The address generator generates a chip address (101001) based upon the activated bits that are applied to the decoder/comparator 530.

The clock oscillator 524, illustrated in FIG. 5, generates a clock signal, which is applied to the voltage detector 526. Voltage detector 526 detects the amplitude of the amplitude modulated power signal 502 at the clock pulses. Voltage detector 526 samples the amplitude modulated power signal 502 at each clock pulse, and transmits the sampled signals to logic processor 528. Logic processor 528 generates logic signals that comprise binary signals that correspond to the amplitude modulated power signals illustrated in FIGS. 6, 7 and 8. The binary data generated by logic processor 528 is applied to the decoder/comparator 530, which reads and decodes the binary data in accordance with the data structure illustrated in FIG. 9. The decoder generates a signal address from the binary data from the logic processor 528 and compares the detected signal address data with the chip address data generated by the address generator 529. If there is a favorable comparison, the remaining illumination binary data detected in accordance with the data structure of FIG. 9 is determined and a control signal 531 is transmitted to the pulse width modulation (PWM) generator 532 that corresponds to the illumination data. The PWM generator 532 generates pulse width modulated power signals that power LEDs 536, 538, 540 in the LED light bank 534. The LEDs 536, 538, 540 are illuminated in accordance with the duty cycle of the pulse width modulated signals. LEDs 536, 538, 540 may be color LEDs, such as primary colors red, green and blue, so that any desired color can be generated from the LED light bank 534 by adjusting the intensity of each of the LEDs 536, 538, 540. The cathodes are connected together and the signal is applied to the VSS output 544. The output of the voltage regulator 504 is also transmitted to the differential switch 542 via connector 522. Output 533 of the PWM generator 532 is also a power signal that is applied to the differential switch 542. Differential switch 542 creates a constant current that is transmitted through the VSS output 544, which may be applied to other individually accessible LED lights, which are connected in series.

Figure 6:
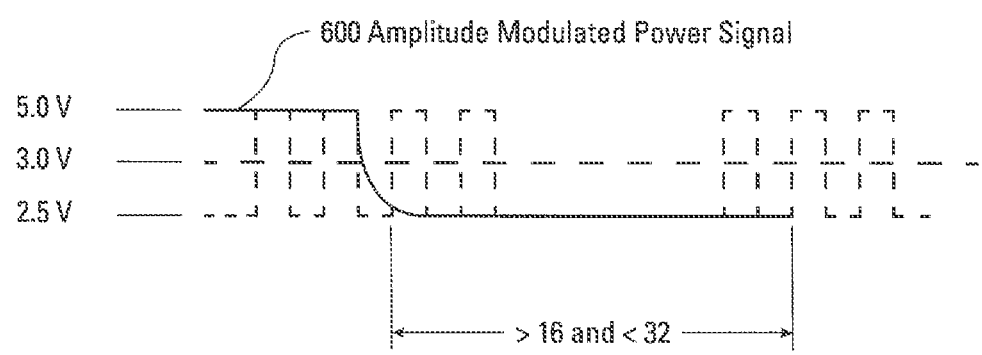
FIG. 6 is a schematic diagram of an address and control signal.

FIG. 6 is a graph of one example of an amplitude modulated power signal 600. As illustrated in FIG. 6, the amplitude modulated power signal 600 has a full voltage of approximately 5 volts. In order to generate a zero binary signal, the voltage drops to 2.5 volts for 16-32 continuous clock pulses. The voltage detector, such as voltage detectors 418 of FIG. 4 and 526 of FIG. 5, detects the voltage drop and generates a voltage amplitude signal for each clock pulse that is approximately 2.5 volts. The logic processor, such as logic processors 420 of FIGS. 4 and 528 of FIG. 5, counts the number of continuous pulses at the 2.5 voltage level. If the number of continuous pulses at the low voltage level is between 16 and 32 pulses, the logic processor creates a binary '0'.

Figure 7:
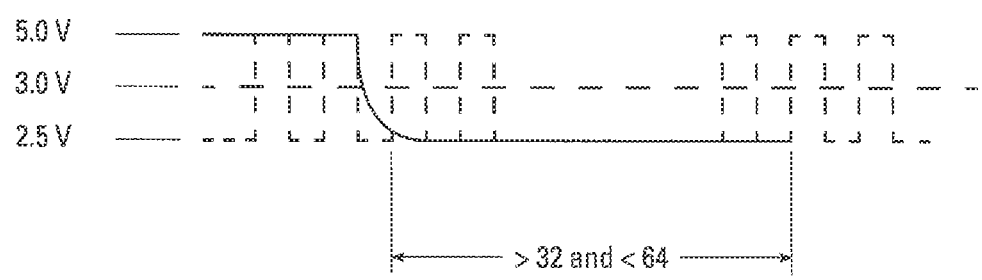
FIG. 7 is a schematic diagram of an embodiment of another address and control signal.

Referring to FIG. 7, if the number of pulses at the low voltage level of 2.5 volts is between 32 and 64 clock pulses, the logic processor creates a binary '1'.

Figure 8:
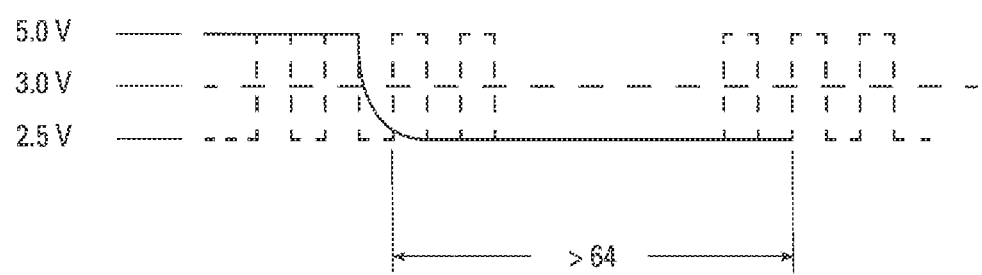
FIG. 8 is a schematic diagram of a mark or flag control signal.

If the number of clock pulses at the low voltage level of 2.5 volts is greater than 64 continuous clock pulses, a mark or flag signal is generated, as illustrated in FIG. 8.

FIG. 9 is a schematic illustration of an example of the data structure that can be used by the pulse width modulation (PWM) generator 532 of FIG. 5, to control the operation of the LED light bank 534. As shown in FIG. 9, sections 902, 904, 906 and 908 of the data structure 900 have four bits. For example, the signal address 902 constitutes the first four bits of the data structure, which are A1, A2, A3 and A4. The next four bits 904 constitute a binary signal having four bits that provides the intensity level (illumination data) for the red LED. These bits are R1, R2, R3 and R4. The next four bits 906 are a four-bit binary signal that indicates the intensity level (illumination data) of the green LED. These four bits are G1, G2, G3 and G4. The next four bits 908 in the data structure constitute a binary signal that indicates a four-bit level intensity (illumination data) for the blue LED. These four bits are B1, B2, B3 and B4. The last bit in the data structure is a mark or flag bit 910. When a mark or flag bit 910 is received, the data structure begins again with the four bits 902 of the address binary signal.

Figure 10:
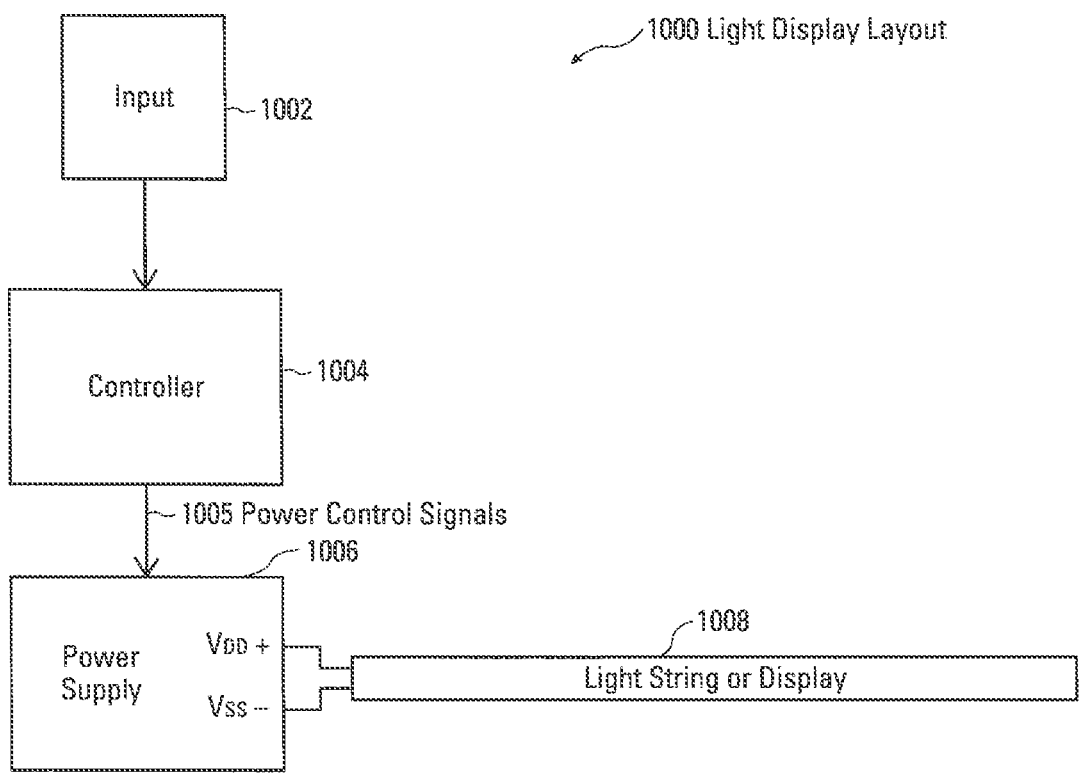
FIG. 10 is a schematic block diagram of a light display layout.

FIG. 10 is a schematic block diagram of a light display layout 1000. As illustrated in FIG. 10, an input 1002 provides data to the controller 1004 as to the manner in which the light string or display of individually accessible lights 1008 is to be illuminated. The controller receives that information and generates power control signals 1005 that control the power supply 1006. The power supply generates a VDD signal and a VSS signal that is applied to the light string or display in accordance with the controller data 1004.

Figure 11:
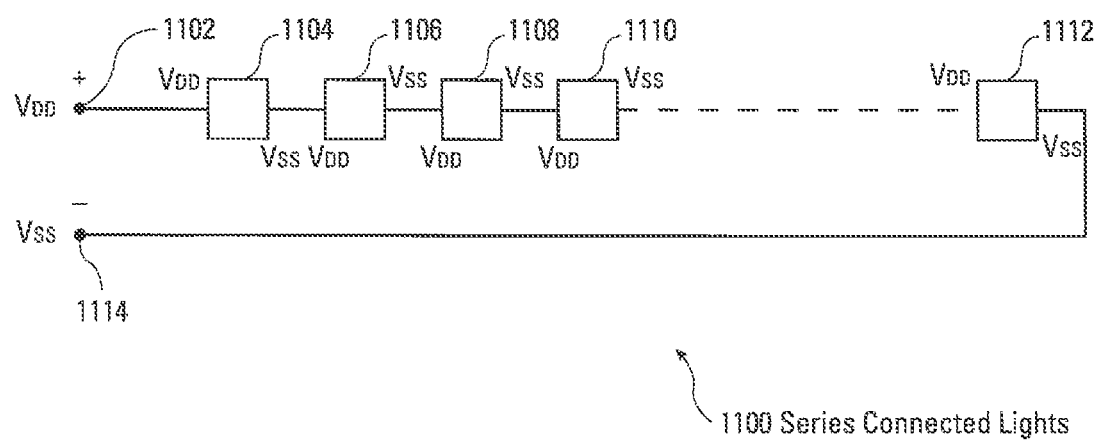
FIG. 11 is a schematic block diagram of a plurality of series connected lights.

FIG. 11 discloses a lighting display with series connected individually accessible LED lights 1100. As shown in FIG. 11, the input 1102, which is VDD, is applied to the first series connected light 1104. The output of the first series connected light 1104 is VSS. VSS is connected to the VDD input to light 1106. The output of series connected light 1106 is VSS, which is connected to the input VDD of series connected light 1108. The output of series connected light 1108 is VSS which is connected to the VDD input of series connected light 1110. This continues on to the last series connected light 1112, which has a VDD input and an output VSS that is connected to the VSS terminal 1114 of the power supply. The amplitude modulated power supply signal, which is encoded with the lighting data, travels through each of the individually accessible LED lights 1104-1112, which are illuminated in accordance with the encoded data and the amplitude modulated power signal.

Figure 12:
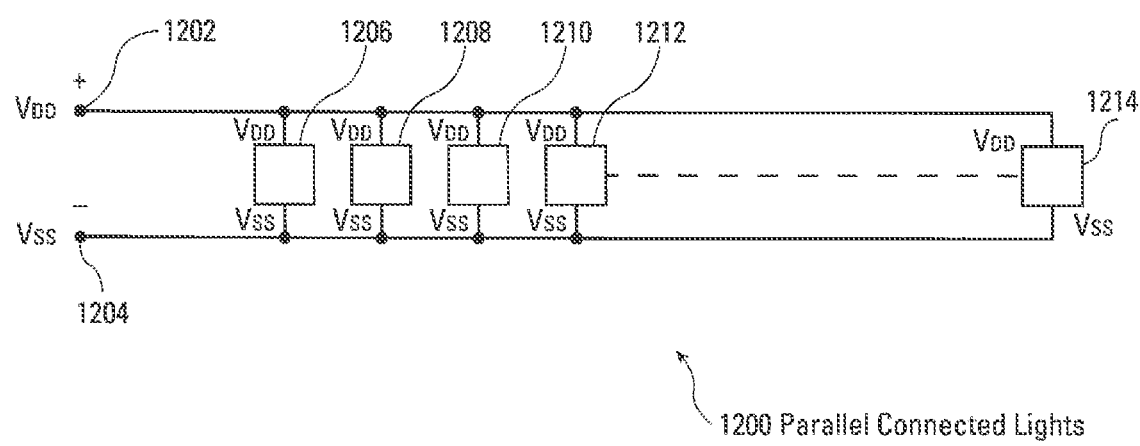
FIG. 12 is a schematic block diagram of parallel connected lights.

FIG. 12 is a schematic block diagram of a plurality of parallel connected individually accessible lights 1200. Parallel connected lights comprise LED lights 1206, 1208, 1210, 1212 and 1214. Each of the VDD inputs to each of the lights 1206-1214 is connected to the VDD terminal 1202 of the power supply. Each of the VSS terminals of the LED lights 1206-1214 is connected to the VSS terminal 1204 of the power supply. The amplitude modulated power signal is applied to the VDD output terminal of the power supply and the encoded data is transmitted to each of the individually accessible LED lights 1206-1214. The encoded amplitude modulated power signal controls the illumination of each of the individually accessible LED lights 1206-1214.

Figure 13:
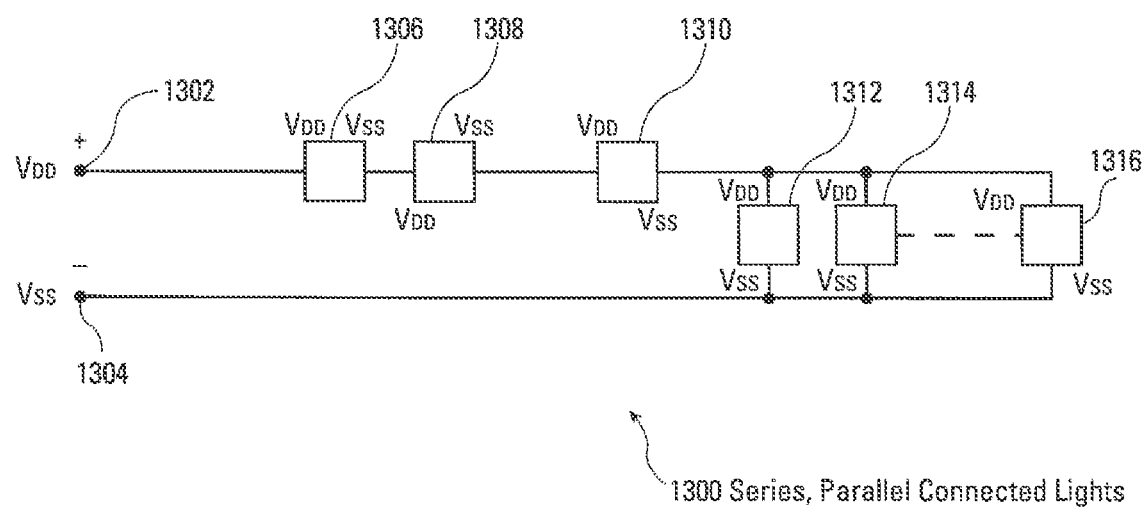
FIG. 13 is a schematic block diagram of an embodiment of both series and parallel connected lights in a single string.

FIG. 13 is a schematic block diagram of a plurality of series and parallel connected individually accessible lights 1300. As shown in FIG. 13, the first set of individually accessible LED lights 1306, 1308, 1310 are connected in series, such that the VSS output of the individually accessible LED lights is connected to the VDD input of the next individually accessible LED light. Individually accessible LED lights 1312, 1314, 1316 are connected in parallel, downstream from the series connected lights. The individually accessible LED lights 1312-1316 are connected so that the VDD inputs are connected to the VSS output of individually accessible LED light 1310, while the VSS outputs are connected to the VSS terminal 1304 of the power supply. The first individually accessible LED light 1306 is connected to the VDD output 1302 of the power supply. The encoded amplitude modulated power signal is transmitted through both the series connected lights 1306-1310 and through the parallel connected LED lights 1312-1316. In this manner, all of the individually accessible LED lights receive the encoded modulated power signal and are illuminated in accordance with the manner in which the amplitude modulated power signal is encoded.

Figure 14:
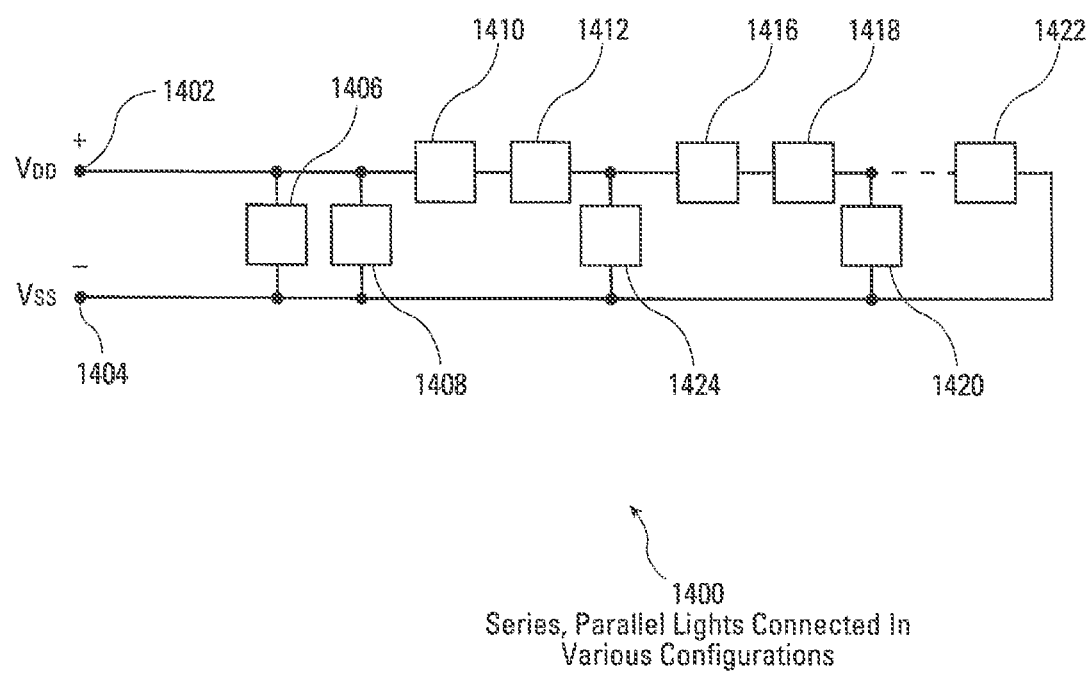
FIG. 14 is a schematic block diagram of an embodiment of both series and parallel lights connected in various configurations.

FIG. 14 is a schematic block diagram of a plurality of series and parallel individually accessible LED lights 1400 that are connected in various configurations. As illustrated in FIG. 14, individually accessible LED lights 1406, 1408 are connected in parallel to the VDD output terminal 1402 of the power supply, while individually accessible LED light 1410 is connected in series to the VDD output terminal 1402. As shown, all of the individually accessible LED lights 1406, 1408, 1410, 1412, 1414, 1416, 1418, 1420, 1422 are connected in various configurations of series and parallel, and in various orders. However, the encoded amplitude modulated power signal applied to the power supply terminals 1402, 1404 is transmitted to all of the individually accessible LED lights no matter what their configuration or order is in the display.

Consequently, various embodiments are disclosed, in which individually accessible LED lights can be illuminated with any desired color or illumination intensity using an encoded amplitude modulated power signal. The individually accessible LED lights can be arranged in series or parallel configurations and in any desired order to achieve the desired display. Each of the individually accessible LED lights can have a separate LED light bank that can comprise any number of LED lights or can be incorporated in a single chip with an address and control circuit.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A system for controlling illumination and color of individual LED lights of a plurality of individually accessible LED lights comprising:
   a power supply that is connected to said plurality of individually accessible LED lights, said power supply generating a power signal that is amplitude modulated with a signal address that is an address encoded in said power signal of at least one of said individual LED lights of said plurality of individually accessible LED lights, and illumination data for said at least one of said individual LED lights of said plurality of individually accessible LED lights, to create an encoded amplitude modulated power signal;
   an address circuit that generates a chip address for said individual LED lights;
   a control circuit in said individual LED lights that compares said chip address with said signal address, downloads said illumination data whenever there is a favorable comparison of said chip address and said signal address and generates pulse width modulation signals in accordance with said illumination data to control illumination of said individual LED lights;
   an LED light bank having at least one LED that receives said pulse width modulation signal and is illuminated in accordance with the duty cycle of said pulse width modulation signal.

2. The system of claim 1 wherein said LED light bank comprises three light emitting diodes that emit primary colors, and wherein said control circuit generates three pulse width modulation signals so that any desired color can be generated by said LED light bank.

3. The system if claim 2 wherein said address circuit, said control circuit and said LED light bank are disposed on a single integrated circuit chip.

4. The system of claim 2 wherein said address circuit comprises a hardwired address circuit.

5. The system of claim 2 wherein said address circuit comprises a programmable address circuit.

6. The system of claim 2 wherein said address circuit comprises a manual switch circuit.

7. A method of controlling illumination and color of individual LED lights of a plurality of individually accessible LED lights that are connected to a power source comprising:
   amplitude modulating a power signal, from said power source, that powers said plurality of individually accessible LED lights, with a signal address and illumination data, to generate an encoded amplitude modulated power signal which individually addresses and controls said individual LED lights;
   transmitting said encoded amplitude modulated power signal to said individual LED lights;
   providing chip addresses that comprise a specified address for said individual LED lights;
   comparing said signal address of said encoded amplitude modulated power signal with said chip addresses of said individual LED lights;
   downloading said illumination data in said individual LED lights whenever there is a favorable comparison between said signal address and said chip address;
   illuminating said individual LED lights in accordance with said illumination data.

8. The method of claim 7 wherein said process of transmitting said encoded amplitude modulated power signal to said individual LED lights comprises:
   transmitting said encoded amplitude modulated power signal to said individual LED lights that are connected in series by regulating both voltage and current of said encoded amplitude modulated power signal in each of said individual LED lights.

9. The method of claim 8 wherein said process of providing chip addresses to said individual LED lights comprises:
   hardwiring chip addresses in said individual LED lights.

10. The method of claim 7 wherein said process of transmitting said encoded amplitude modulated power signal to said individual LED lights comprises:
    transmitting said encoded amplitude modulated power signal to said individual LED lights that are connected in both parallel and series configurations by regulating both voltage and current of said encoded amplitude modulated power signal in said individual LED lights.

11. The method of claim 7 wherein said process of providing chip addresses to said individual LED lights comprises:
    hardwiring chip addresses in said individual LED lights.

12. The method of claim 7 wherein said process of providing chip addresses to said individual LED lights comprises:
    programming said chip addresses in said individual LED lights.

13. The method of claim 7 wherein said process of providing chip addresses to said individual LED lights comprises:
    setting switches on said individual LED lights.

14. The method of claim 7 further comprising:
    forming said individual LED lights so that a single integrated circuit chip stores said chip address for each of said individual LED lights in an address circuit, compares said chip address with said signal address, downloads said illumination data whenever there is a favorable comparison of said chip address and said signal address and generates a pulse width modulation signal in accordance with said illumination data in a control circuit, and generating light from an LED light bank disposed on said single integrated circuit chip.

* * * * *